(12) United States Patent
Kawahara et al.

(10) Patent No.: US 8,829,649 B2
(45) Date of Patent: Sep. 9, 2014

(54) SEMICONDUCTOR DEVICE HAVING A RESISTIVE ELEMENT INCLUDING A TASIN LAYER

(71) Applicant: Renesas Electronics Corporation, Kawasaki (JP)

(72) Inventors: Jun Kawahara, Kanagawa (JP); Naoya Inoue, Kanagawa (JP); Naoya Furutake, Kanagawa (JP); Yoshihiro Hayashi, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 13/670,138

(22) Filed: Nov. 6, 2012

(65) Prior Publication Data
US 2013/0168817 A1    Jul. 4, 2013

(30) Foreign Application Priority Data

Nov. 7, 2011   (JP) ................................. 2011-243266

(51) Int. Cl.
| | | |
|---|---|---|
| H01L 29/00 | (2006.01) | |
| H01L 29/76 | (2006.01) | |
| H01L 29/94 | (2006.01) | |
| H01L 31/062 | (2012.01) | |
| H01L 31/113 | (2006.01) | |
| H01L 31/119 | (2006.01) | |
| H01L 49/02 | (2006.01) | |
| H01L 27/08 | (2006.01) | |
| H01L 23/522 | (2006.01) | |
| H01L 27/06 | (2006.01) | |

(52) U.S. Cl.
CPC ............ *H01L 28/24* (2013.01); *H01L 27/0802* (2013.01); *H01L 23/5228* (2013.01); *H01L 27/0629* (2013.01); *Y10S 257/904* (2013.01)
USPC ...... 257/537; 257/379; 257/904; 257/E27.047

(58) Field of Classification Search
USPC ........................... 257/379, 537, 904, E27.047
See application file for complete search history.

(56) References Cited

U.S. PATENT DOCUMENTS

| | | | | |
|---|---|---|---|---|
| 5,684,323 A * | 11/1997 | Tohyama | ...................... | 257/363 |
| 6,489,882 B2 * | 12/2002 | Lee | ................. | 338/309 |
| 6,653,713 B2 * | 11/2003 | Takasu | .......... | 257/538 |
| 6,667,523 B2 * | 12/2003 | Woodbury et al. | ............ | 257/382 |
| 6,667,537 B1 * | 12/2003 | Koike et al. | ................... | 257/536 |
| 6,670,660 B2 * | 12/2003 | Hosotani | ...................... | 257/295 |
| 6,700,203 B1 * | 3/2004 | Cabral et al. | ................ | 257/774 |
| 6,759,729 B1 * | 7/2004 | Racanelli et al. | ............. | 257/536 |
| 7,183,593 B2 * | 2/2007 | Yeo et al. | ...................... | 257/195 |

(Continued)

FOREIGN PATENT DOCUMENTS

| | | |
|---|---|---|
| JP | 62-224002 A | 10/1987 |
| JP | 6-275409 A | 9/1994 |

(Continued)

*Primary Examiner* — Ida M Soward
(74) *Attorney, Agent, or Firm* — Miles & Stockbridge P.C.

(57) ABSTRACT

A semiconductor device includes a first insulating layer (interlayer insulating layer), a resistive element that is disposed over the first insulating layer (interlayer insulating layer) and at least a surface layer of which is a TaSiN layer, and an interlayer insulating layer disposed over the first insulating layer (interlayer insulating layer) and the resistive element. Multiple via plugs having ends coupled to the TaSiN layer are disposed in the interlayer insulating layer.

11 Claims, 10 Drawing Sheets

(56) References Cited

U.S. PATENT DOCUMENTS

| | | | |
|---|---|---|---|
| 7,298,020 B2 * | 11/2007 | Asano et al. | 257/536 |
| 7,307,335 B2 * | 12/2007 | Kim et al. | 257/533 |
| 7,323,751 B2 * | 1/2008 | Beach et al. | 257/359 |
| 7,402,871 B2 * | 7/2008 | Song | 257/379 |
| 7,796,426 B2 * | 9/2010 | Tonomura et al. | 365/163 |
| 8,174,355 B2 | 5/2012 | Takeda et al. | |
| 8,367,513 B2 * | 2/2013 | Nagashima | 438/382 |
| 2001/0011760 A1 * | 8/2001 | Kim | 257/537 |
| 2002/0033750 A1 | 3/2002 | Oizumi et al. | |
| 2008/0237800 A1 * | 10/2008 | Chinthakindi et al. | 257/537 |
| 2010/0252894 A1 * | 10/2010 | Shim | 257/379 |
| 2012/0313220 A1 * | 12/2012 | Yang et al. | 257/537 |

FOREIGN PATENT DOCUMENTS

| | | |
|---|---|---|
| JP | 2001-332402 A | 11/2001 |
| JP | 2002-43102 A | 2/2002 |
| JP | 2004-342705 A | 12/2004 |
| JP | 2007-73651 A | 3/2007 |
| JP | 2008-10604 A | 1/2008 |
| JP | 2009-21509 A | 1/2009 |

\* cited by examiner

SEMICONDUCTOR DEVICE HAVING A RESISTIVE ELEMENT INCLUDING A TASIN LAYER

CROSS-REFERENCE TO RELATED APPLICATIONS

The disclosure of Japanese Patent Application No. 2011-243266 filed on Nov. 7, 2011 including the specification, drawings and abstract is incorporated herein by reference in its entirety.

BACKGROUND

The present invention relates to a semiconductor device and a method for manufacturing the same.

The resistance of a resistive element is preferably stable with respect to variations in the temperature of the environment. For this reason, resistive elements are required to have a smaller temperature coefficient of resistance. Various resistive elements, resistors, or the like, including those described below, have been proposed.

Japanese Unexamined Patent Publication No. 2001-332402 discloses a resistive material. The resistive material essentially consists of four elements-Al, B, Cr, and Si. The resistive element has a resistivity of 4 m$\Omega$·cm or more and an absolute temperature coefficient of resistance of 300 ppm/° C. or less. Thus, the Publication states that it is possible to provide a resistive element having a small absolute temperature coefficient of resistance and a large resistivity.

Japanese Unexamined Patent Publication No. 2007-073651 discloses a thin-film resistor which is formed over a substrate having electrical insulation properties and which contains a Cr—Al—Si ternary alloy. By adjusting the composition ratio of the elements, the resistivity of the thin-film resistor becomes 500 $\mu\Omega$·cm or more; the absolute temperature coefficient of resistance becomes 50 ppm/° C. or less; and the rate of change of the resistance after maintained at 155° C. for 1000 hours becomes 0.05% or less. Thus, the Publication states that it is possible to provide a highly heat-resistant thin-film resistor which has a high resistivity and a low temperature coefficient of resistance and which exhibits a low resistance change rate when heated during operation.

Japanese Unexamined Patent Publication No. 2008-010604 discloses a thin-film resistive material that contains 20 to 60 mass % of Ta, 2 to 10 mass % of Al, 0.5 to 15 mass % of Mo, and the balance containing Cr and Ni where a mass ratio Cr/Ni is 0.75 to 1.1. Thus, the Publication states that a thin-film resistor using this thin-film resistive material has a significantly improved volume resistance and salt water resistance, compared to a conventional thin-film resistor using a resistive thin film containing a Ni—Cr—Al—Si alloy.

Japanese Unexamined Patent Publication No. Hei6-275409 discloses the following method for manufacturing a thin-film resistive element. A TaN layer is formed by sputtering Ta in an atmosphere of a mixed gas of a noble gas element selected from the group consisting of Ne, Ar, Kr, and Xe, and nitrogen. A noble gas element is sputtered onto the TaN layer using a RF electrode apparatus. Thus, the Publication states that a temperature coefficient of resistance close to 0 ppm/° C. can be obtained stably without requiring vacuum annealing.

Japanese Unexamined Patent Publication No. 2004-342705 discloses the following TaN thin-film resistor. An electrode film is formed over the top surface of a TaN thin film formed over an insulating substrate with an intermediate film therebetween. Referring to the combined temperature coefficient of resistance of the intermediate film and the electrode film as a first temperature coefficient of resistance and to the temperature coefficient of resistance of the thin-film resistor as a second temperature coefficient of resistance, the sum of the first and second temperature coefficients of resistance is set to −10 ppm/° C. to 0 ppm/° C. Thus, the Publication states that the temperature coefficient of resistance can be kept small across the entire operating temperature region in consideration of the contact resistance of the electrode film.

Japanese Unexamined Patent Publication No. 2009-021509 discloses a semiconductor device. The semiconductor device includes a resistive element containing nitrogen and tantalum as main constituent elements disposed over the main surface of a substrate. The top region of the resistive element, which is located opposite to the substrate, has a nitrogen concentration of 30 at % or more. Thus, the Publication states that it is possible to provide a semiconductor device including a resistive element having a low parasitic capacitance and a resistance which varies to a lesser extent when subjected to heat treatment.

Japanese Unexamined Patent Publication No. 2002-043102 discloses a thin-film resistor for inkjet printer. This thin-film resistor contains TaSiN having a high Si concentration. The TaSiN thin film has a Si concentration (Si/(Si+Ta)) between 40% and 80% and a N concentration between 2.5% and 50%. Thus, the Publication states that it is possible to provide a thin-film resistor which has a high resistivity and a small temperature coefficient of resistance and which can be uniformly heated as a heater material.

Japanese Unexamined Patent Publication No. Sho62-224002 discloses the following method for manufacturing a thin-film chip resistor. First, a resistive film containing NiCr, TaN, or the like is deposited over an entire surface of a substrate by vapor deposition, sputtering, or the like. Subsequently, a metal film to serve as an electrode is deposited. Subsequently, the resistive film is patterned. Further, a SiN film to serve as a protective film is formed over the resistive film by chemical vapor deposition (CVD). Thus, the Publication states that it is possible to provide a thin-film chip resistor which is significantly stable with respect to the resistance and the rate of change thereof.

SUMMARY

Lithium-ion batteries have been widely used in recent years, particularly in mobile phones or the like. When mounting in electric vehicles, a multi-cell lithium ion battery is mounted thereon. Efficient use of a multi-cell lithium ion battery requires monitoring of the remaining charge of each cell with high accuracy.

An external sense resistor is used in order to detect the remaining charge with high accuracy. In particular, a wide range of operating temperatures must be assured in car-mounted applications. Accordingly, it is desired to minimize the temperature coefficient of resistance of the sense resistor itself.

In recent years, it is desired to form a resistive element as described above in the multilayer wiring of a semiconductor device as part of an integrated circuit. For this reason, it is desired to minimize the temperature coefficient of resistance as described in the above-mentioned related-art examples, as well as to minimize the area of the element. Accordingly, a resistive element having a low temperature coefficient of resistance and a high resistivity is desired.

A first aspect of the present invention provides a semiconductor device. The semiconductor device includes: a first insulating layer; a resistive element that is disposed over the first insulating layer and at least a surface of which is a TaSiN layer; and an interlayer insulating layer disposed over the first insulating layer and the resistive element. Multiple via plugs having ends coupled to the TaSiN layer are disposed in the interlayer insulating layer.

A second aspect of the present invention provides a method for manufacturing a semiconductor device. The method for manufacturing a semiconductor device includes: a step of forming a TaN layer over a first insulating layer; a silane application step of modifying at least a surface layer of the TaN layer to a TaSiN layer by applying a Si-containing gas; a step of forming an interlayer insulating layer over the first insulating layer and the resistive element; and a step of forming multiple via plugs having ends coupled to the TaSiN layer in the interlayer insulating layer.

According to the aspects of the present invention, the resistive element at least the surface layer of which is the TaSiN layer is disposed over the first insulating layer. The via plugs having ends coupled to the TaSiN layer are formed in the interlayer insulating layer disposed over the first insulating layer and the resistive element. Thus, a semiconductor device can be provided that has a resistive element with a high resistivity and a small temperature coefficient of resistance in multilayer wiring.

According to the aspects of the present invention, semiconductor device can be provided that has a resistive element with a high resistivity and a small temperature coefficient of resistance in multilayer wiring.

DETAILED DESCRIPTION

Now, embodiments of the present invention will be described with reference to the accompanying drawings. Like elements are given like reference signs throughout the drawings and therefore descriptions thereof will be omitted as appropriate.

First Embodiment

Figure 1A:
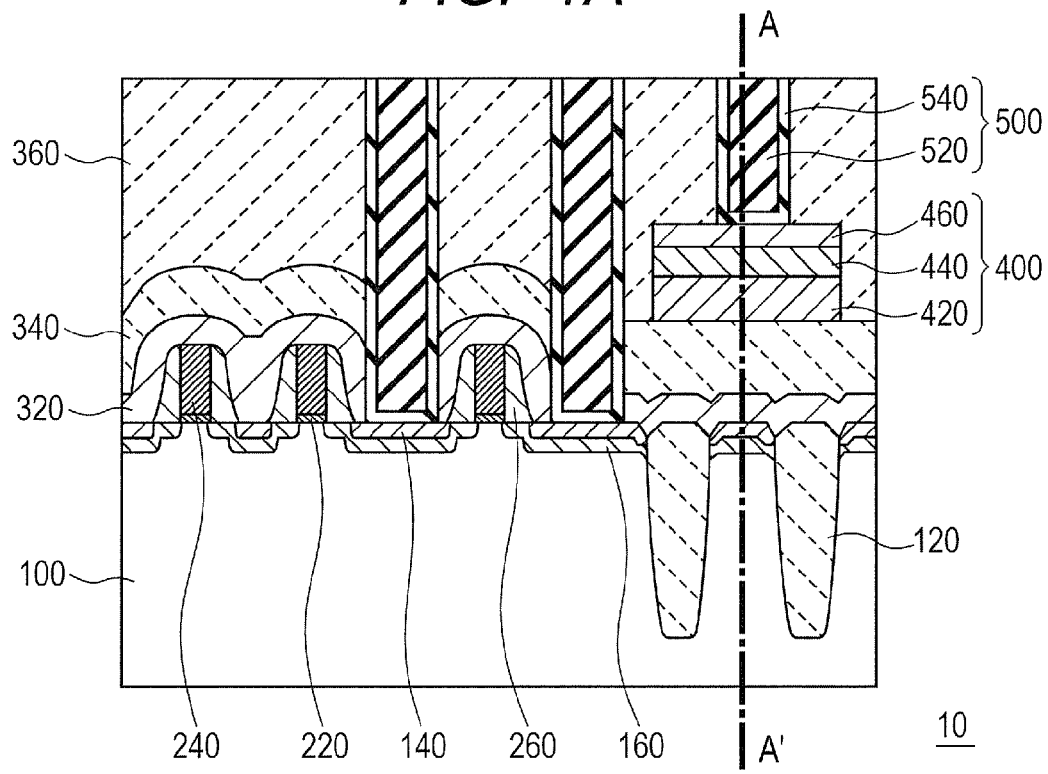
FIGS. 1A and 1B are sectional views showing the configuration of a semiconductor device according to a first embodiment.
Figure 1B:
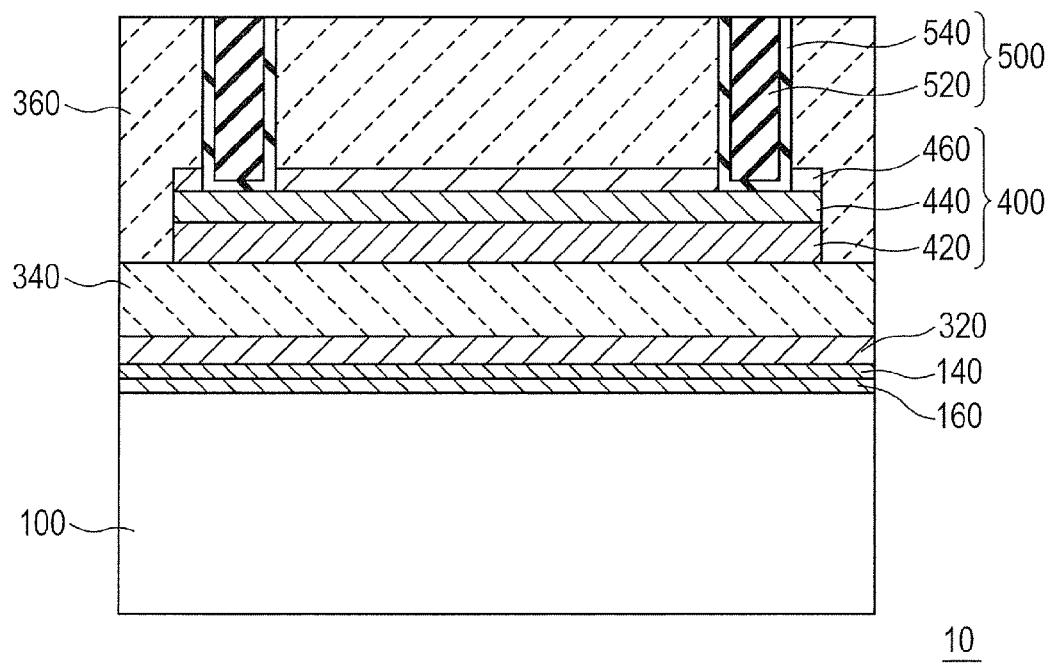
Figure 2:
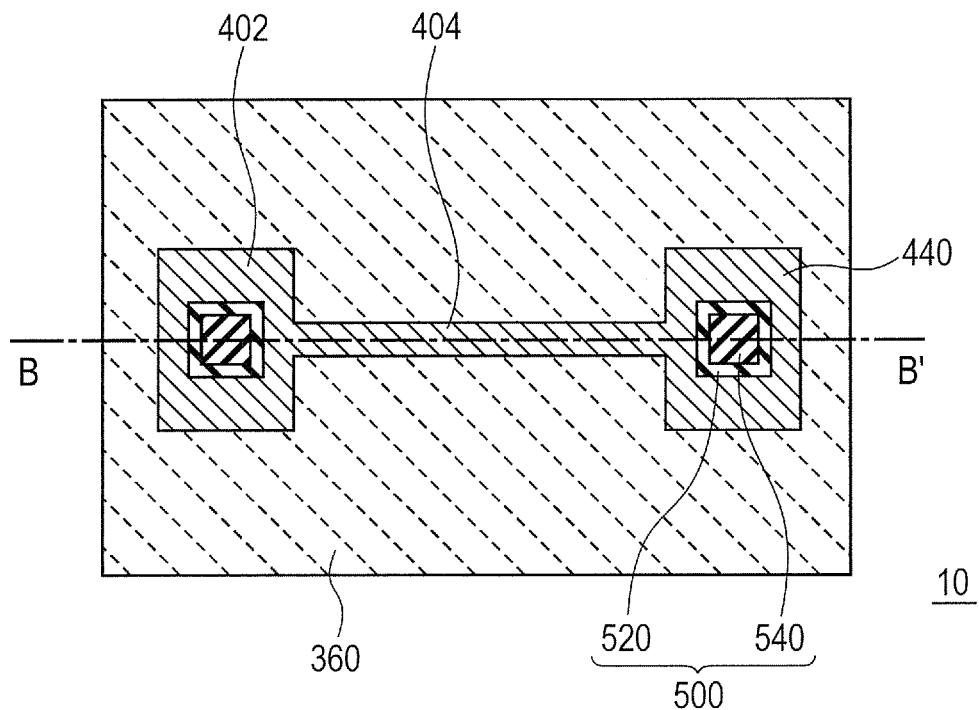
FIG. 2 is a plan view showing the configuration of the semiconductor device according to the first embodiment.

Referring to FIGS. 1 and 2, a semiconductor device 10 according to a first embodiment will be described. The semiconductor device 10 is configured as follows. That is, the semiconductor device 10 includes a first insulating layer (interlayer insulating layer 340), a resistive element 400 which is disposed over the first insulating layer (interlayer insulating layer 340) and at least a surface layer of which is a TaSiN layer 440, an interlayer insulating layer 360 disposed over the first insulating layer (interlayer insulating layer 340) and the resistive element 400, and multiple via plugs 500 that are disposed in the interlayer insulating layer 360 and that have ends coupled to the TaSiN layer 440. Details will be described below.

FIGS. 1A and 2B are sectional views showing the configuration of the semiconductor device 10 according to the first embodiment, in which FIG. 1B is a sectional view taken along line A-A' of FIG. 1A.

As shown in FIG. 1A, a semiconductor substrate 100 includes element isolation regions 120. The semiconductor substrate 100 is, for example, a silicon substrate. The element isolation regions 120 contain $SiO_2$ and are formed by local oxidation of silicon (LOCOS).

The semiconductor substrate 100 also has field effect transistors (FETs) in the region where the element isolation regions 120 are not formed. This region includes diffusion regions 140 serving as source regions or drain regions and extension regions 160. Alternatively, this region may include bipolar transistors.

A gate insulating layer 220 is disposed over channel regions (having no reference sign) interposed by the diffusion regions 140. Gate electrodes 240 are disposed over the gate insulating layer 220. A sidewall insulating layer 260 is disposed around both sides of the gate insulating layer 220 and those of the gate electrodes 240.

A liner insulating layer 320 is disposed over these FETs. The liner insulating layer 320 contains, for example, SiN.

A first insulating layer, an interlayer insulating layer 340, is disposed over the liner insulating layer 320. The "first insulating layer" refers to an insulating layer disposed below the resistive element 400 to be discussed later. In the first embodiment, the first insulating layer is, for example, the interlayer insulating layer 340. The interlayer insulating layer 340 contains, for example, $SiO_2$, SiN, SiON, SiOC, SiOCH, SiCOH, or SiOF.

The first insulating layer may include multiple layers. If the first insulating layer, the interlayer insulating layer 340, includes a porous film such as a low-k film, a dense insulating layer (not shown) such as a SiCN layer may be disposed over the low-k film.

The resistive element 400 at least a surface layer of which is the TaSiN layer 440 is disposed over the first insulating layer, the interlayer insulating layer 340.

The "resistive element 400" refers to a resistive element including at least the TaSiN layer 440. Broadly, a resistive element including a TaN layer 420 to be discussed later or having the via plugs 500 serving as terminals may be referred to as the resistive element 400.

The TaSiN layer 440 is a modified layer formed by applying a Si-containing gas to the TaN layer 420. In other words, the TaSiN layer 440 is a layer formed by doping the surface layer of the TaN layer 420 with Si. In this embodiment, the ternary TaSiN layer 440 can easily be formed by forming the TaN layer 420 and then applying a Si-containing gas thereto. The silane application step of applying a Si-containing gas will be described in detail later.

The resistive element 400 also includes the TaN layer 420 disposed over the interlayer insulating layer 340. The TaSiN layer 440 is disposed over a surface layer of the TaN layer 420. As seen, where the resistive element 400 also includes the TaN layer 420, it is designed as a parallel circuit of the TaSiN layer 440 and the TaN layer 420.

The TaN layer 420 is 10 nm or more and 100 nm or less thick, preferably 10 nm or more and 50 nm or less thick. The TaN layer 420 can be formed by reactive sputtering, as long as the thickness thereof falls within the above-mentioned range. For example, the TaN layer 420 is 20 nm thick.

The TaSiN layer 440 is 1 nm or more and 50 nm or less thick, preferably 1 nm or more and 15 nm or less thick. The TaSiN layer 440 can be easily formed in a silane application step to be discussed later, as long as the thickness thereof falls within the above-mentioned range. For example, the TaSiN layer 440 is 5 nm thick.

As will be discussed later, in the manufacturing process, the TaN layer 420 formation step is followed by the Si-containing gas application step (silane application step). Thus, the surface layer of the TaN layer 420 is changed to silicide, forming the TaSiN layer 440. The inventors have found that the temperature coefficient of resistance (TCR) and the resistivity of the TaSiN layer 440 can be controlled by adjusting the composition ratio Si/(Ta+Si) in the silane application step.

The absolute TCR of the resistive element 400 is 0 ppm/° C. or more and 50 ppm/° C. or less, preferably 0 ppm/° C. or more and 25 ppm/° C. or less. A resistive element 400 whose resistance varies to a lesser extent in a wide operating temperature range can be obtained, as long as the TCR thereof falls within the above-mentioned range.

The sheet resistance of the TaSiN layer 440 is, for example, $10^2$ Ω/sq or more and $10^7$ Ω/sq or less. Such a high sheet resistance allows the area of the resistive element to be reduced. Such a resistive element having a reduced area can be disposed in the multilayer wiring of a semiconductor chip or the like.

The resistivity of the TaN layer 420 is adjusted according to the desired resistivity of the TaSiN layer 440. The resistivity of the TaN layer 420 can be adjusted by changing the composition ratio Ta/N. For example, the composition ratio Ta/N is 0.5 or more and 10 or less. The resistivity of the TaN layer 420 serving as the source of the TaSiN layer 440 can become $10^2$ μΩ·cm or more and $10^6$ μΩ·cm or less, as long as the composition ratio Ta/N falls within the above-mentioned range.

The composition ratio Si/(Ta+Si) of the TaSiN layer 440 is 0.5 or more and 0.7 or less. A TaSiN layer 440 having the desired resistivity and TCR can be obtained as long as the composition ratio Si/(Ta+Si) falls within the above-mentioned range.

The TaN layer 420 formation step and the TaSiN layer 440 formation step will be described in detail later.

A SiN layer 460 is disposed over the resistive element 400. Specifically, the SiN layer 460 is disposed over the TaSiN layer 440. As will be discussed later, in the silane application step, the SiN layer 460 as well as the TaSiN layer 440 are formed over the TaN layer 420. As seen, in the silane application step, forming the SiN layer 460 over the TaN layer 420 allows the TaSiN layer 440 to be formed over the surface layer of the TaN layer 420. As a result, the resistive element 400 having the above-mentioned configuration is obtained.

The SiN layer 460 serves also as an etching stopper film in the step of forming the via plugs 500. Accordingly, the SiN layer 460 is preferably formed so as to have the same thickness as the liner insulating layer 320. Thus, the formation of the via plugs 500 can be controlled under the same etching condition in the step of forming the via plugs 500.

The SiN layer 460 need not necessarily be disposed over the TaSiN layer 440. That is, the SiN layer 460 may be eliminated in the manufacturing process. However, the SiN layer 460 is preferably formed only over contact portions 402 of the resistive element 400 to which the via plugs 500 are coupled.

The TaSiN layer 440 is amorphous. The use of the TaSiN layer 440 that is amorphous, that is, isotropic controls variations in the characteristics of the resistive element caused by thermal stress generated in the process of manufacturing the semiconductor device 10.

The interlayer insulating layer 360 is disposed over the interlayer insulating layer 340 and the resistive element 400. The multiple via plugs 500 are formed in the interlayer insulating layer 360. Some of the via plugs 500 are in contact with the diffusion regions 140 of FETs at ends thereof.

A via plug 500 is formed directly on the resistive element 400 in such a manner that an end thereof is coupled to the TaSiN layer 440.

The via plug 500 coupled to the resistive element 400 is in contact with the TaSiN layer 440 at least at the end thereof. The via plug 500 penetrates through the SiN layer 460, making contact with the TaSiN layer 440. The end of the via plug 500 may penetrate into the TaSiN layer 440. Where the resistive element 400 includes the TaN layer 420, the end of the via plug 500 may penetrate into the TaN layer 420. That is, the end of the via plug 500 is only required to be electrically coupled to the TaSiN layer 440.

A barrier layer 540 is disposed over the sidewall and bottom of each via plug 500. The barriers layer is, for example, a TiN/Ti layer. The TiN layer thereof is disposed over the sidewall and bottom of each via plug 500. If the barrier layer 540 is a TiN/Ti layer, the adhesion between the barrier layer 540 and the TaSiN layer 440 can be increased.

A metal 520 is disposed inside the barrier layer 540 of each via plug 500. The metal 520 is, for example, Cu, W, or the like.

As shown in FIG. 1B, two via plugs 500 are coupled to both ends of the resistive element 400. The region between the two via plugs serves as a resistance portion 404 to be discussed later. In this way, the resistive element 400 can be disposed in the multilayer wiring of the semiconductor device 10.

In the multilayer wiring, an additional interlayer insulating layer (not shown), wiring (not shown), and via plugs (not shown) may be disposed over the interlayer insulating layer 360. An electrode pad (not shown) may be disposed as the uppermost layer of the multilayer wiring.

FIG. 2 is a plan view showing the configuration of the semiconductor device according to the first embodiment. FIG. 2 is a plan view when FIG. 1B is viewed from above and shows only the TaSiN layer 440, the via plugs 500, and the interlayer insulating layer 360 of FIG. 1B. The TaSiN layer 440 is disposed in the interlayer insulating layer 360 and shown by a solid line.

As shown in FIG. 2, the resistive element 400 includes the contact portions 402 for coupling at least both ends of the TaSiN layer 440 to the via plugs 500 and the resistance portion 404 between the contact portions 402.

The contact portions 402 are, for example, rectangular in plan view. The shape of the contact portions 402 is not limited to a rectangle and may be a circle. The via plugs 500 are disposed in the contact portions 402 in plan view.

For example, the resistance portion 404 is formed so as to be smaller in width than the contact portions 402 in plan view. Further, the resistance portion 404 is linear. As a result, the resistive element 400 has a small area but a high resistivity.

The width and length of the resistance portion 404 are designed such that the resistance portion 404 has the desired resistance. As a result, in the semiconductor device 10, the standard potential can be obtained with respect to a given current owing to the resistive element 400.

Where the elongated resistance portion 404 is formed as shown in FIG. 2, tensile stress may be applied to the resistance portion 404 owing to thermal stress in the manufacturing process. However, the amorphous TaSiN layer 440 can relax the tensile stress. This prevents cracks from occurring in the resistance portion 404.

Figure 3:
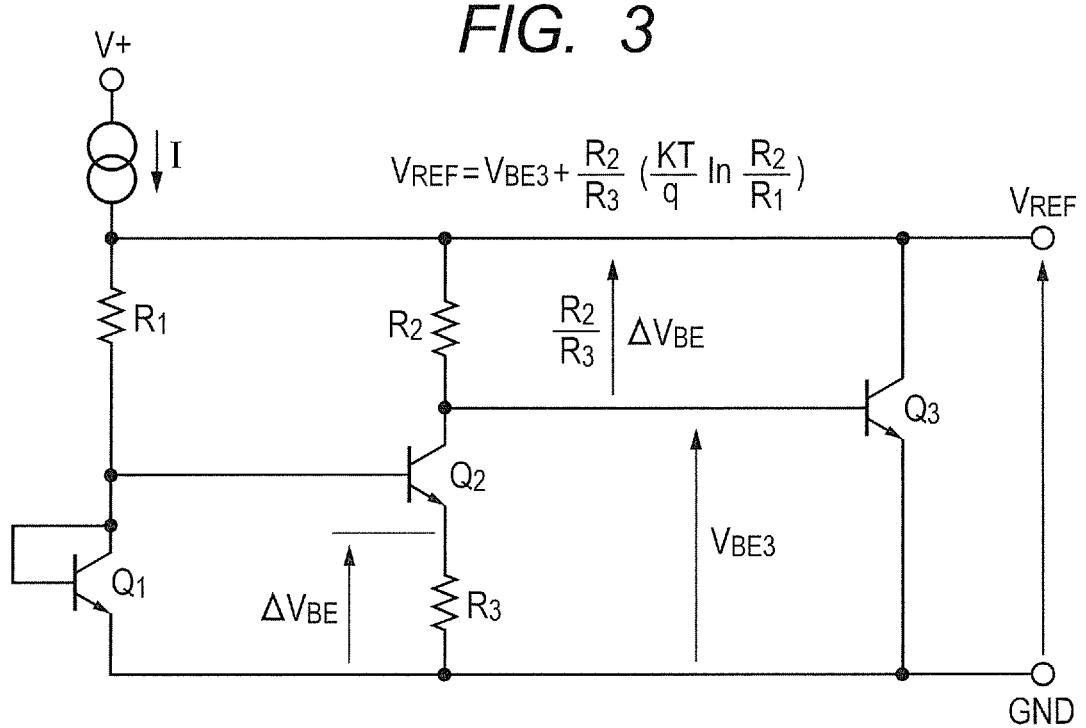
FIG. 3 is a circuit diagram showing the configuration of the semiconductor device according to the first embodiment.

Referring to FIG. 3, a circuit diagram of the semiconductor device 10 according to the first embodiment will be described. FIG. 3 is a circuit diagram showing the configuration of the semiconductor device 10 according to the first embodiment. For example, the resistive element 400 constitutes part of a band gap reference (BGR) circuit as follows. For example, the BGR circuit determines the output voltage of a power supply IC. Details will be described below.

As shown in FIG. 3, this BGR circuit includes a constant current source I, three resistors $R_1$, $R_2$, and $R_3$, and three transistors $Q_1$, $Q_2$, and $Q_3$. The transistor $Q_1$ and the like are FETs or bipolar transistors disposed over the semiconductor substrate 100. The resistive element R1 and the like are resistive elements 400 at least a surface layer of which is the TaSiN layer 440. The constant current source I is formed, for example, by shorting the gate and source of the above-mentioned FET together.

The constant current source I, the resistive element $R_1$, and the transistor $Q_1$ are coupled together in series. The base and collector of the transistor $Q_1$ are shorted together. The resistive element $R_2$, the transistor $Q_2$, and the resistive element $R_3$ are coupled together in series in this order so as to be in parallel with the resistive element $R_1$ and the transistor $Q_1$. Coupled to the collector of the transistor $Q_1$ is the gate of the transistor $Q_2$. Coupled to the resistive element $R_2$, the transistor $Q_2$, and the resistive element $R_3$ in parallel is the transistor $Q_3$. Coupled to the collector of the transistor $Q_2$ is the gate of the transistor $Q_3$. The potential between the emitter and collector of the transistor $Q_3$ is a reference voltage VREF.

The VREF of FIG. 3 is given by Formula (1) below.

[Formula 1]

$$V_{REF} = V_{BE3} + \frac{R_2}{R_3}\left(\frac{KT}{q}\ln\frac{R_2}{R_1}\right) \quad (1)$$

In Formula 1, $V_{BE3}$ represents the voltage between the base and emitter of the transistor $Q_3$; $R_1$ to $R_3$ represent respective resistances; K represents the Boltzmann constant; q represents the elementary charge; and T represents the temperature.

The temperature coefficient of VREF is given by Formula (2) below on the basis of Formula (1).

[Formula 2]

$$\frac{\partial V_{REF}}{\partial T} = \frac{\partial V_{BE3}}{\partial T} + \frac{K}{q}\left(\frac{R_2}{R_3}\ln\frac{R_2}{R_1}\right) \quad (2)$$

In Formula (2); the first term on the right side represents the temperature coefficient of the base-emitter voltage. In general, the temperature coefficient of the base-emitter voltage in a Si semiconductor shows a negative value. Accordingly, by adjusting the shape of the resistive element 400, the resistances of the resistors $R_1$ to $R_3$ are set such that the second term cancels out the first term. As a result, a temperature-compensated (no-temperature dependent) reference voltage VREF can be obtained. Further, the use of the resistive elements 400 according to the first embodiment as the resistors $R_1$ to $R_3$ can reduce variations in temperature characteristics of the resistance. As a result, a stable reference voltage circuit can be formed. If a second-order temperature characteristic compensation circuit, a third-order temperature characteristic compensation circuit, and a higher order temperature characteristic compensation circuit each including the resistive elements 400 according to the first embodiment are disposed in addition to this reference voltage circuit, variations in temperature characteristics of the output voltage can be further reduced.

The semiconductor device 10 including the resistive element 400 as described above can also be used as, for example, a sense resistance circuit for detecting the remaining charge of a Li ion battery.

Figure 4A:
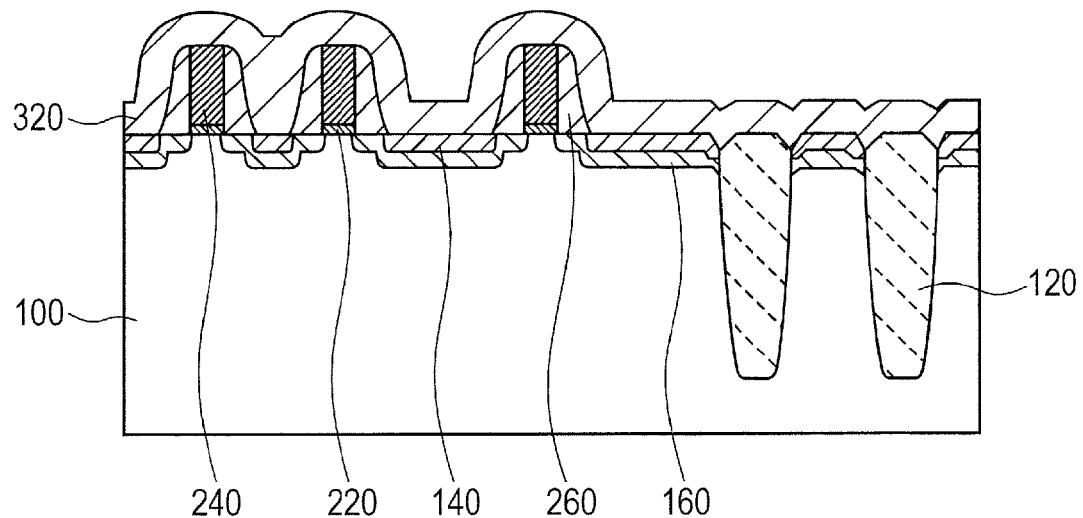
FIGS. 4A and 4B are sectional view showing a method for manufacturing the semiconductor device according to the first embodiment.
Figure 6A:
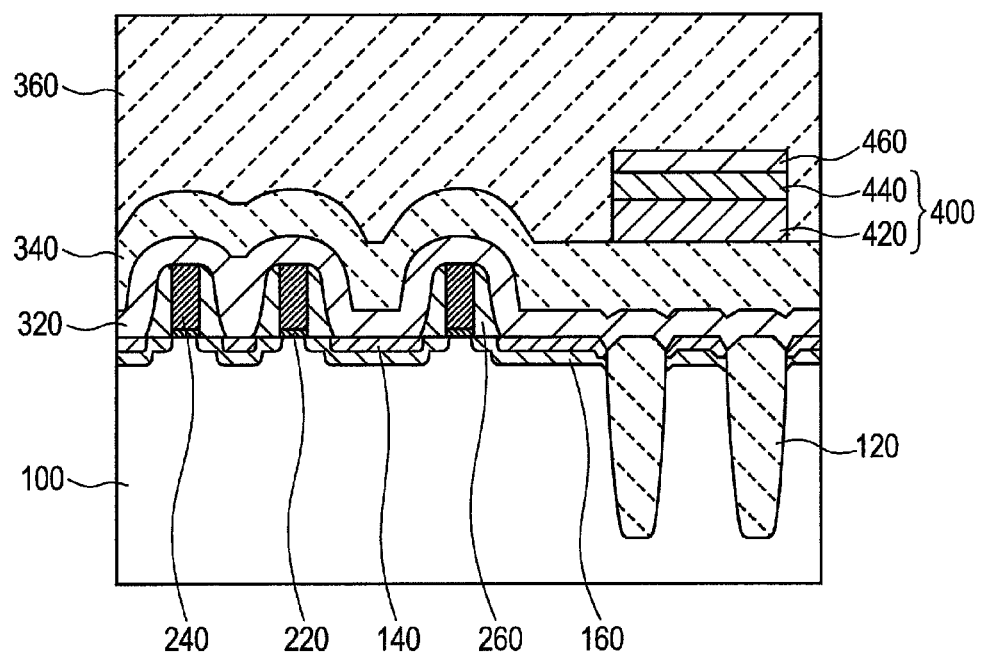
FIGS. 6A and 6B are sectional views showing the method for manufacturing the semiconductor device according to the first embodiment.
Figure 6B:
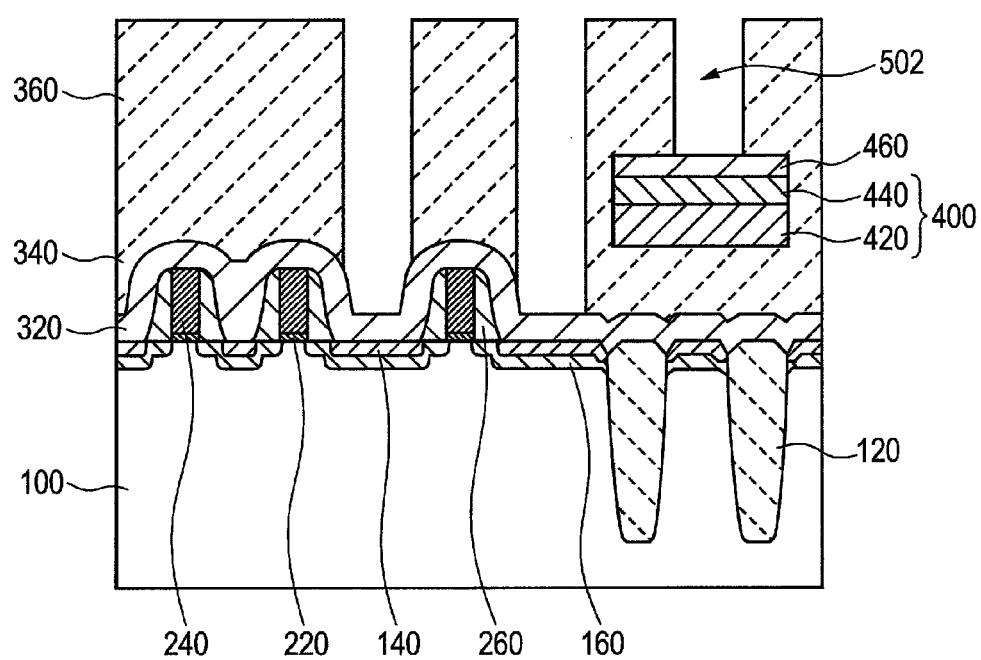
Figure 7A:
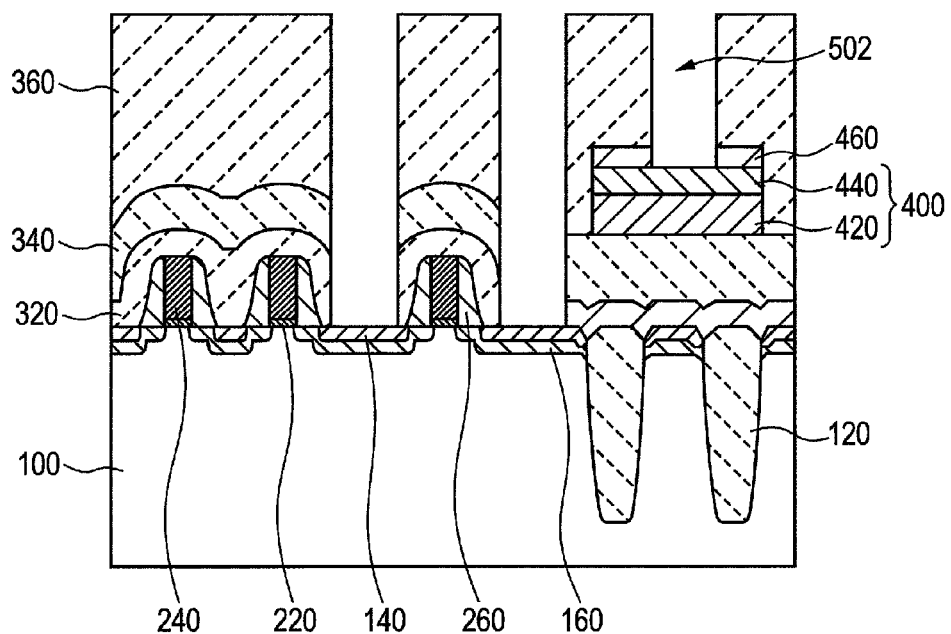
FIGS. 7A and 7B are sectional views showing the method for manufacturing the semiconductor device according to the first embodiment.
Figure 7B:
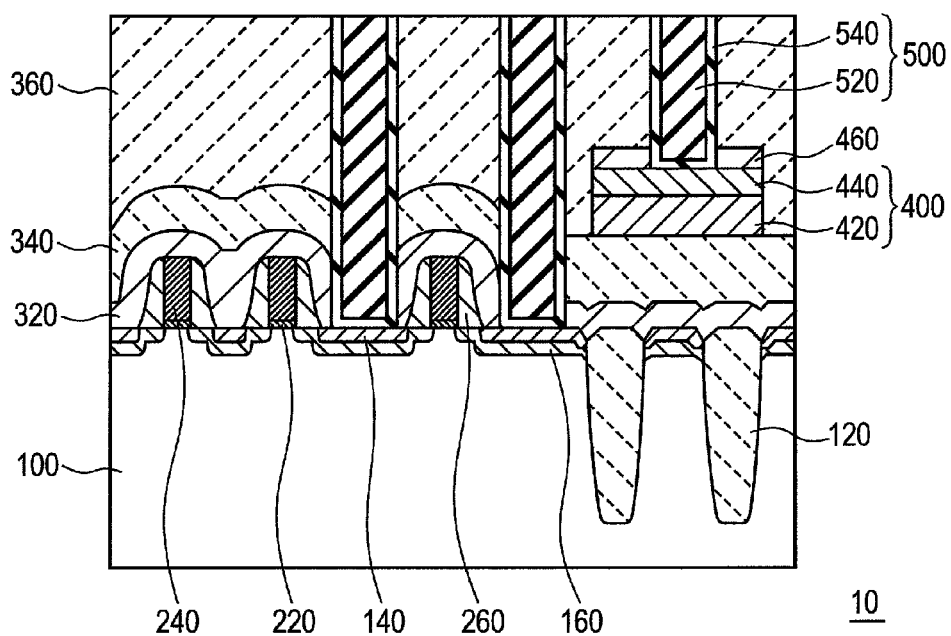

Referring to FIGS. 4A and 7B, a method for manufacturing the semiconductor device 10 according to the first embodiment will be described. FIGS. 4A to 7B are sectional views showing the method for manufacturing the semiconductor device according to the first embodiment. The method for manufacturing the semiconductor device 10 includes the following steps. First, the TaN layer 420 is formed over the first insulating layer (interlayer insulating layer 340). Subsequently, a Si-containing gas is applied to the TaN layer 420. Thus, at least a surface layer of the TaN layer 420 is modified to the TaSiN layer 440 (silane application step). Subsequently, the interlayer insulating layer 360 is formed over the first insulating layer (interlayer insulating layer 340) and the resistive element 400. Subsequently, the multiple via plugs 500 are formed in the interlayer insulating layer 360 in such a manner that ends thereof are coupled to the TaSiN layer 440. Details will be described below.

First, as shown in FIG. 4A, FETs are formed over the semiconductor substrate 100.

Specifically, first, the element isolation regions 120 are formed in the semiconductor substrate 100 by LOCOS. Subsequently, the gate insulating layer 220 and the gate electrodes 240 are formed over the semiconductor substrate 100 so as to have the respective desired shapes. Subsequently, using the gate insulating layer 220 and the gate electrodes 240 as masks, impurities are ion-implanted into the semiconductor substrate 100 to form the extension regions 160. Subsequently, the sidewall insulating layer 260 is formed over both sidewalls of the gate insulating layer 220 and those of the gate electrodes 240. Subsequently, using the gate insulating layer 220, the gate electrodes 240, and the sidewall insulating layer 260 as masks, impurities are ion-implanted into the semiconductor substrate 100 to form the diffusion regions 140. In this way, the FETs are formed over the semiconductor substrate 100. Further, the liner insulating layer 320 is formed over the semiconductor substrate 100 having the FETs formed thereover.

Figure 4B:
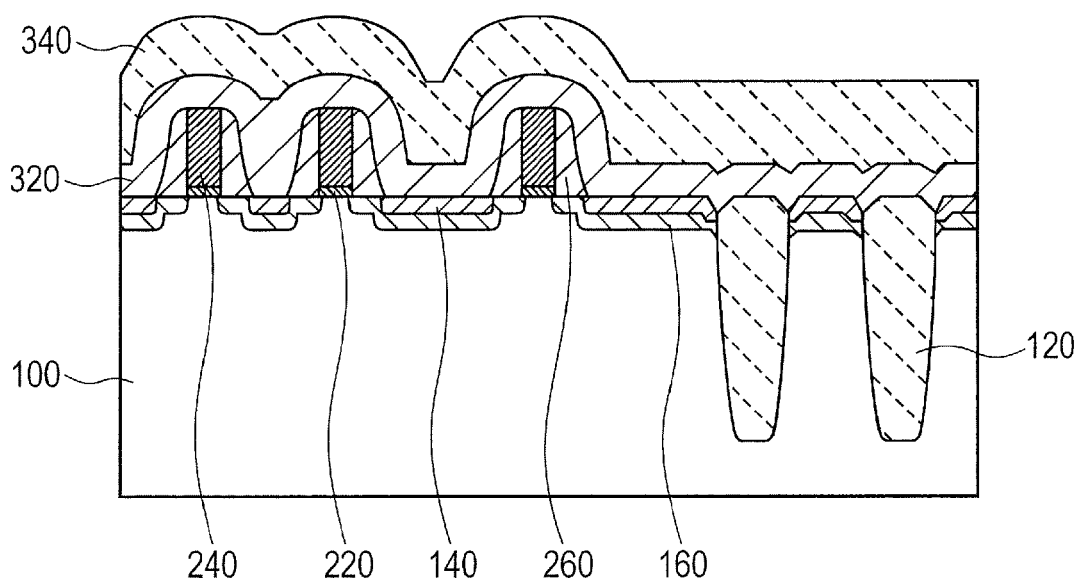

Subsequently, as shown in FIG. 4B, the first insulating layer, the interlayer insulating layer 340, is formed over the liner insulating layer 320 by CVD. If the interlayer insulating layer 340 is a low-k film, a SiCN layer or the like may be formed over the interlayer insulating layer 340.

Figure 5A:
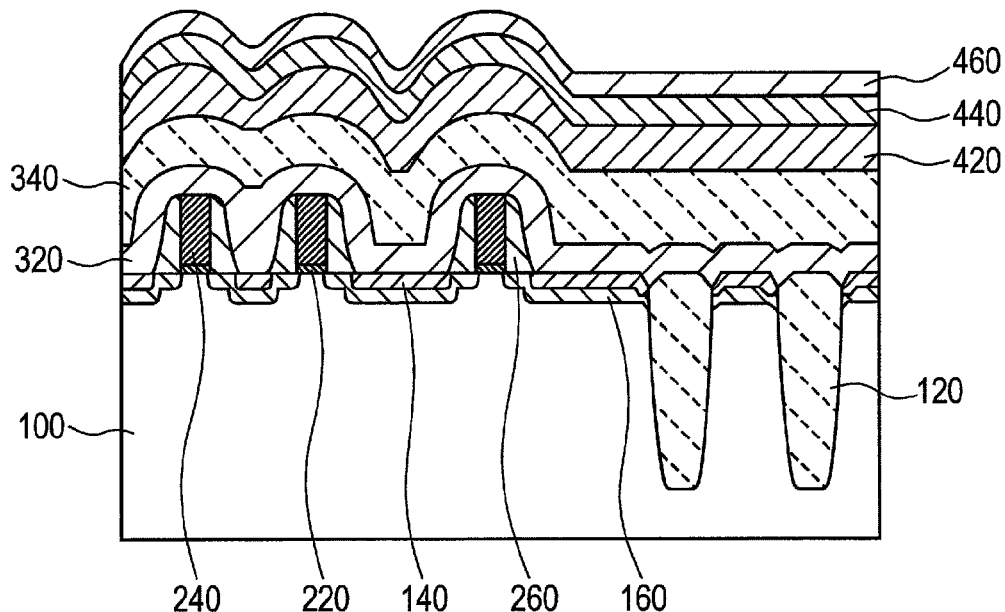
FIGS. 5A and 5B are sectional views showing the method for manufacturing the semiconductor device according to the first embodiment.
Figure 5B:
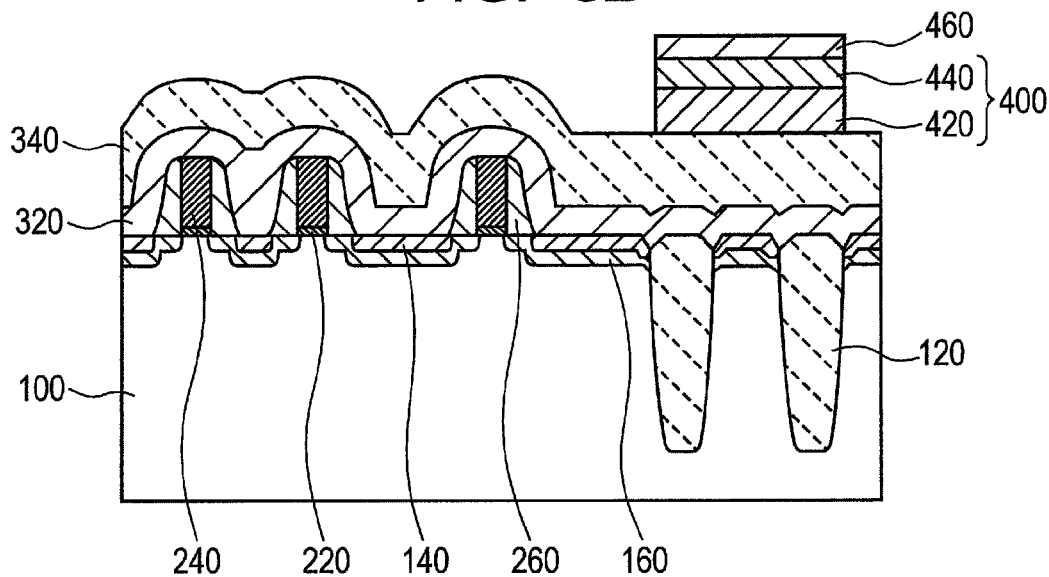

Subsequently, as shown in FIG. 5B, the TaN layer 420 is formed over the entire surface of the first insulating layer, the interlayer insulating layer 340, by reactive sputtering. At this time, a Ta target is used, and a nitrogen gas is used as a reactive gas.

As described above, the resistivity of the TaN layer 420 varies according to the composition ratio Ta/N. Accordingly, the resistivity of the TaN layer 420 is controlled by adjusting the flow rate of the nitrogen gas in this reactive sputtering to obtain the desired composition ratio Ta/N. Thus, the resistivity of the TaN layer 420, which is the source of the TaSiN layer 440 to be discussed later, can be controlled so that the TaSiN layer 440 will have the desired resistivity. The TaN layer 420 is formed with a thickness of 50 nm.

Subsequently, a Si-containing gas is applied to the TaN layer 420 to modify at least a surface layer of the TaN layer 420 to the TaSiN layer 440 (silane application step). That is, the TaSiN layer 440 is a modified layer formed by applying a Si-containing gas to the TaN layer 420.

"Applying a Si-containing gas" in the silane application step refers to applying to the TaN layer 420 a Si-containing gas which is converted into plasma using radio frequency waves, light, or the like. This Si-containing plasma gas is highly reactive and, for example, reacts with the TaN layer 420 to modify it to silicide. In other words, the Si-containing gas is applied to the TaN layer 420 to dope the TaN layer 420 with Si. As seen, applying the Si-containing plasma gas to the surface layer of the TaN layer 420 allows at least the surface layer of the TaN layer 420 to be modified to the TaSiN layer 440.

The "Si-containing gas" is preferably a Si-containing gas including no organic substituent group. On the other hand, organic Si-containing gases such as tetramethylsilane (Si$(CH_3)_4$) and tetraethoxysilane (Si$(OC_2H_5)_4$) are undesirable since carbon (C) may enter the TaSiN layer 440. Specific examples of the Si-containing gas include monosilane (SiH$_4$) and disilane (Si$_2$H$_6$).

The silane application step is performed with the semiconductor substrate 100 heated to, e.g., 200° C. or more and 400° C. or less.

In this silane application step, the resistivity, the resistance temperature coefficient, and thickness of the TaSiN layer 440 are controlled on the basis of the above-mentioned composition ratio and resistivity of the TaN layer 420 by adjusting the application amount of the Si-containing gas. Accordingly, the reactivity, resistance temperature coefficient, and thickness of the TaSiN layer 440 can be controlled by controlling the reactivity and resistance temperature coefficient of the TaN layer 420 in the reactive sputtering, as well as can be controlled in the silane application step. That is, the characteristics of the TaSiN layer 440 can be controlled in two stages.

Another conceivable method for forming the TaSiN layer 440 is to form it by reactive co-sputtering while using Ta and Si targets and using nitrogen as a reactive gas. However, performing co-sputtering as described above involves adjusting various conditions such as electric power to be applied to the two targets, the flow rate of the reactive gas, pressure during film formation, and the like. It is extremely difficult to optimize the film formation conditions so that the TaSiN layer 440 has the desired characteristics. In this embodiment, on the other hand, the TaSiN layer 440 is formed by applying the Si-containing gas to the previously formed TaN layer 420 having the desired composition ratio in the silane application step. This makes it possible to form the TaSiN layer 440 having the desired characteristics more easily than by performing co-sputtering as described above.

In the silane application step, a plasma CVD apparatus for forming a SiO$_2$ film or SiN film may be used. Accordingly, the same apparatus as that used in the step of forming the SiN layer 460 to be discussed later can be used.

Specifically, in this silane application step, the SiN layer 460 is formed over the TaN layer 420, and the TaSiN layer 440 is formed over the interface between the SiN layer 460 and the TaN layer 420. That is, when the SiN layer 460 is formed over the TaN layer 420, the Si-containing gas is necessarily applied to the surface layer of the TaN layer 420. This allows the TaSiN layer 440 to be formed over the interface between the SiN layer 460 and the TaN layer 420. Note that the SiN layer 460 is formed over the entire surface of the TaN layer 420.

For example, the SiN layer 460 is formed with a thickness of e.g., 20 nm over the TaN layer 420. Thus, the Si-containing gas is applied to the TaN layer 420 to a 10 nm depth. As a result, the TaSiN layer 440 is formed with a thickness of 5 nm.

As shown in FIG. 5B, the TaSiN layer 440 and the SiN layer 460 are patterned in a step after the silane application step. First, a photoresist film (not shown) is applied to the SiN layer 460. Subsequently, patterning is performed in such a manner that the resistive element 400 has the desired shape, by exposing the photoresist film to light and developing it. Subsequently, the TaN layer 420, the TaSiN layer 440, and the SiN layer 460 are etched by reactive ion etching (RIE). Subsequently, the photoresist film is peeled off. In this way, the resistive element 400 is patterned.

Subsequently, as shown in FIG. 6A, the interlayer insulating layer 360 is formed over the first insulating layer, the interlayer insulating layer 340, and over the resistive element 400 by CVD.

Subsequently, as shown in FIG. 6B, multiple via holes 502 are formed by etching the interlayer insulating layer 340 and the interlayer insulating layer 360 by RIE. At this time, some via holes 502 are disposed so as to overlap the diffusion regions 140 of the FETs in plan view. Further, two via holes 502 are disposed in the contact portions 402 of the resistive element 400 in plan view.

At this time, the etching for forming the via holes 502 is stopped on the respective top surfaces of the liner insulating layer 320 and the SiN layer 460. That is, the liner insulating layer 320 and the SiN layer 460 serve as etching stopper films. As shown in FIG. 6B, even when the resistive element 400 is disposed at a different height from those of the FETs, formation of the via holes 502 can be stopped simultaneously by forming the top surface of the SiN layer 460 serving as an etching stopper film at a higher position.

Subsequently, as shown in FIG. 7A, the liner insulating layer 320 and the SiN layer 460 are etched by RIE so that the via holes 502 penetrate therethrough. At this time, the etching conditions are adjusted so that ends of the via holes 502 come into contact with the TaSiN layer 440.

Subsequently, as shown in FIG. 7B, the barrier layer 540 is formed inside the via holes 502 and over the interlayer insulating layer 360. A TiN layer and a Ti layer are formed in this order to form the barrier layer 540.

Subsequently, the metal 520 is disposed over the barrier layer 540 of the via holes 502 by CVD so as to fill the via holes 502. The metal 520 is, for example, W. The material for the metal 520 is, for example, WF$_6$. A metal such as Cu may be disposed by plating after forming a seed layer (not shown) over the barrier layer 540 in the via holes 502.

Subsequently, the surface of the interlayer insulating layer 360 is flattened by chemical mechanical polishing (CMP). In this way, the via plugs 500 are formed.

In the multilayer wiring, an additional interlayer insulating layer (not shown), wiring (not shown), and via plugs (not shown) may be formed over the interlayer insulating layer 360. Further, an electrode pad (not shown) may be formed as the uppermost layer of the multilayer wiring.

Although not shown, the semiconductor device 10 is packaged in the following steps. First, the semiconductor substrate 100 obtained in the above-mentioned process is diced to form semiconductor chips (not shown). Subsequently, the semiconductor chips are mounted over the die pad of a lead frame (not shown). Subsequently, electrode pads of the semiconductor chips and the inner lead are coupled together using bonding wires. Subsequently, the lead frame is sealed using a sealing resin. Subsequently, unwanted leads are cut off. Subsequently, outer leads are bent so as to have the desired shapes. In this way, the semiconductor device 10 is obtained.

Next, effects of the first embodiment will be described.

According to the first embodiment, the resistive element 400 at least the surface layer of which is the TaSiN layer 440 is disposed over the first insulating layer, the interlayer insulating layer 340. The via plugs 500 are formed in the interlayer insulating layer 360 disposed over the first insulating layer (interlayer insulating layer 340) and the resistive element 400. Ends of two via plugs 500 are coupled to the TaSiN layer 440. Thus, the semiconductor device 10 that includes the resistive element 400 having a high resistivity and a small temperature coefficient of resistance in the interlayer insulating layer (interlayer insulating layer 340, interlayer insulating layer 360, or the like) can be provided.

Second Embodiment

Figure 8A:
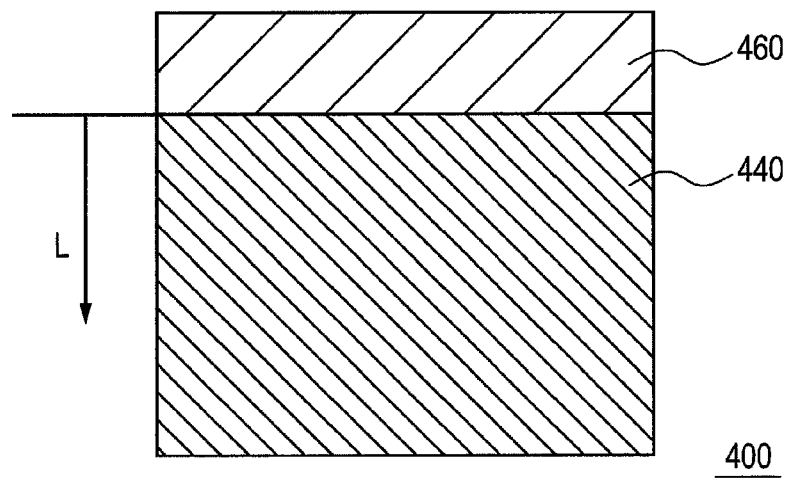
FIGS. 8A and 8B are diagrams showing the configuration of a resistive element according to a second embodiment.
Figure 8B:
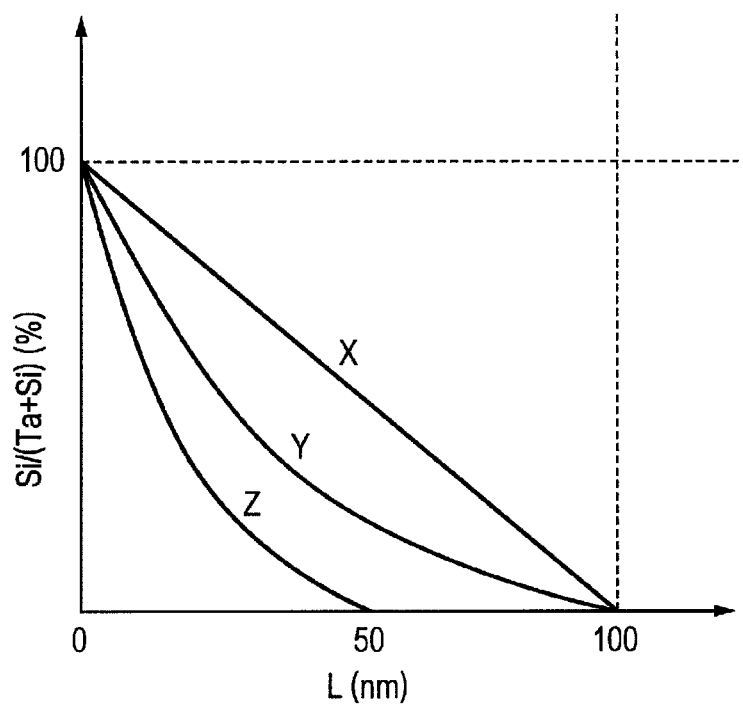

FIGS. 8A and 8B are diagrams showing the configuration of the resistive element 400 according to a second embodiment. The second embodiment is the same as the first embodiment except that the composition ratio of the TaSiN layer 440 changes in such a manner that the Si concentration becomes higher toward the surface layer of the TaSiN layer 440. Details will be described below.

FIG. 8A shows the resistive element 400 according to the second embodiment. In the second embodiment, the composition ratio Si/(Ta+Si) of the TaSiN layer 440 changes. Since the resistive element 400 may include no portion serving as the TaN layer 420, FIG. 8A does not show the TaN layer 420.

In FIG. 8A, the length of the TaSiN layer 440 starting from the bottom surface of the SiN layer 460 is represented by L (nm).

FIG. 8B shows the distribution of the composition ratio Si/(Ta+Si) of the TaSiN layer 440. The horizontal axis represents the length of the TaSiN layer 440 from the bottom surface of the SiN layer 460, L (nm). The vertical axis represents the composition ratio Si/(Ta+Si) of the TaSiN layer 440.

As shown in FIG. 8B, the composition ratio of the TaSiN layer 440 changes in such a manner that the Si concentration becomes higher toward the surface layer. In this embodiment, the TaSiN layer 440 is formed by forming the TaN layer 420 with a thickness of 100 nm and then performing the silane application step.

For X of FIG. 8B, the composition ratio Si/(Ta+Si) decreases monotonously and linearly, starting from the bottom of the SiN layer 460. If a composition ratio for obtaining the desired resistivity or temperature coefficient of resistance is predetermined, the via plugs 500 are formed to the length L where the composition ratio is obtained.

For Y of FIG. 8B, the composition ratio Si/(Ta+Si) decreases monotonously and parabolically, starting from the bottom surface of the SiN layer 460.

For Z of FIG. 8B, the composition ratio of Si/(Ta+Si) changes in a range of 0≤L≤50 nm. Accordingly, L>50 nm means the TaN layer 420. In this way, the TaSiN layer 440 is formed over the desired length L. The TaN layer 420 may remain in the portion exceeding the length. The distribution where the composition ratio changes may be other than these distributions.

A method for manufacturing the semiconductor device 10 according to the second embodiment is the same as that according to the first embodiment except that the TaSiN layer 440 is formed in the silane application step in such a manner that the composition ratio changes so that the Si concentration becomes higher toward the surface layer.

In the subsequent step of forming the via plugs 500, the via plugs 500 are formed until reaching the TaSiN layer 440 having the desired composition ratio. As a result, the resistive element 400 having the desired resistivity and temperature coefficient of resistance is formed.

If it is difficult to form the TaSiN layer 440 where the composition ratio changes as described above by performing the silane application step once, the TaSiN layer 440 having the above-mentioned composition ratios may be formed by repeating the silane application step multiple times after forming the TaN layer 420.

While, in the second embodiment, the composition ratio changes so that the Si concentration decreases monotonously, the composition ratio may change in a step-wise manner.

According to the second embodiment, the composition ratio of the TaSiN layer 440 changes so that the Si concentration becomes higher toward the surface layer thereof. Thus, a resistive element 400 having any resistivity and temperature coefficient of resistance can be provided.

Third Embodiment

Figure 9A:
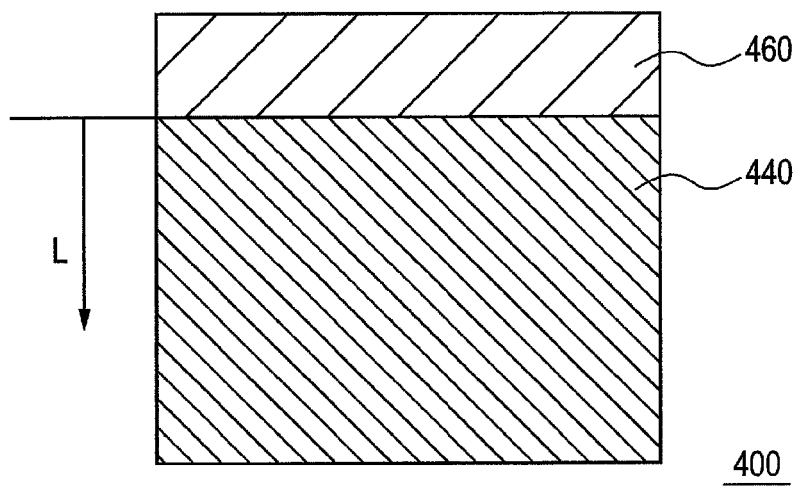
FIGS. 9A and 9B are diagrams showing the configuration of a resistive element according to a third embodiment.
Figure 9B:
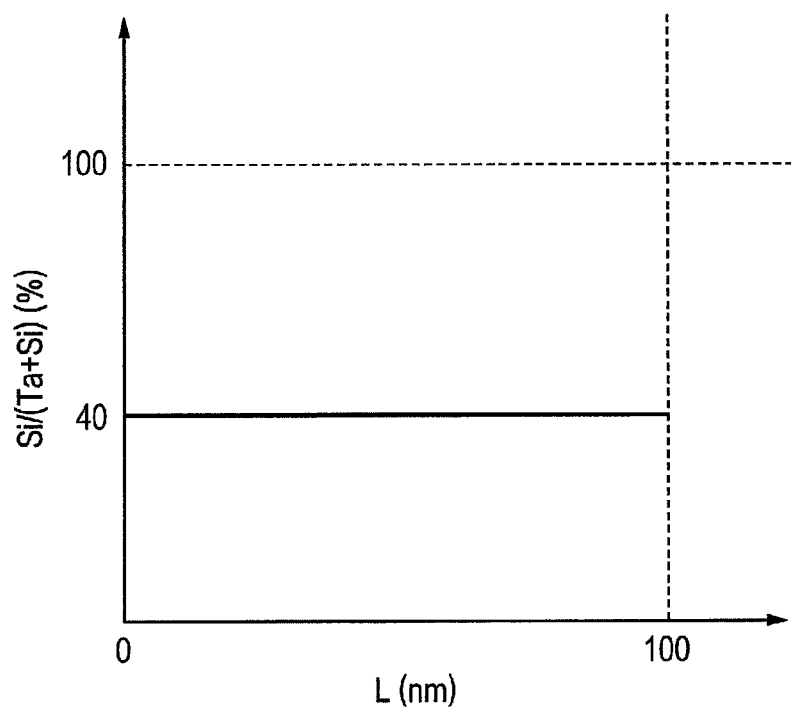

FIGS. 9A and 9B are diagrams showing the configuration of the resistive element 400 according to a third embodiment. The third embodiment is the same as the first embodiment except that the composition ratio is the same across the TaSiN layer 440. Details will be described below.

FIG. 9A shows the resistive element 400 according to the third embodiment. In the third embodiment, the TaSiN layer 440 is formed by modifying the entire TaN layer 420.

As with FIG. 8B, FIG. 9B shows the distribution of the composition ratio Si/(Ta+Si) of the TaSiN layer 440.

As shown in FIG. 9B, the composition ratio Si/(Ta+Si) of the TaSiN layer 440 is kept constant at, e.g., 40%. This composition ratio can become a composition ratio for obtaining the desired resistivity and temperature coefficient of resistance.

A method for manufacturing the semiconductor device 10 according to the third embodiment is the same as that according to the first embodiment except that the TaSiN layer 440 is formed in such a manner that the composition ratio is the same across the TaSiN layer 440.

If it is difficult to form the TaSiN layer 440 having the same composition ratio across itself as described above by performing the silane application step once, the TaSiN layer 440 having the same composition ratio may be formed by repeating the silane application step multiple times after forming the TaN layer 420.

According to the third embodiment, the composition ratio of the TaSiN layer 440 is constant. Thus, a resistive element 400 that has a constant resistivity and temperature coefficient of resistance without depending on the positions at which ends of the via plugs 500 are formed can be provided.

Fourth Embodiment

Figure 10A:
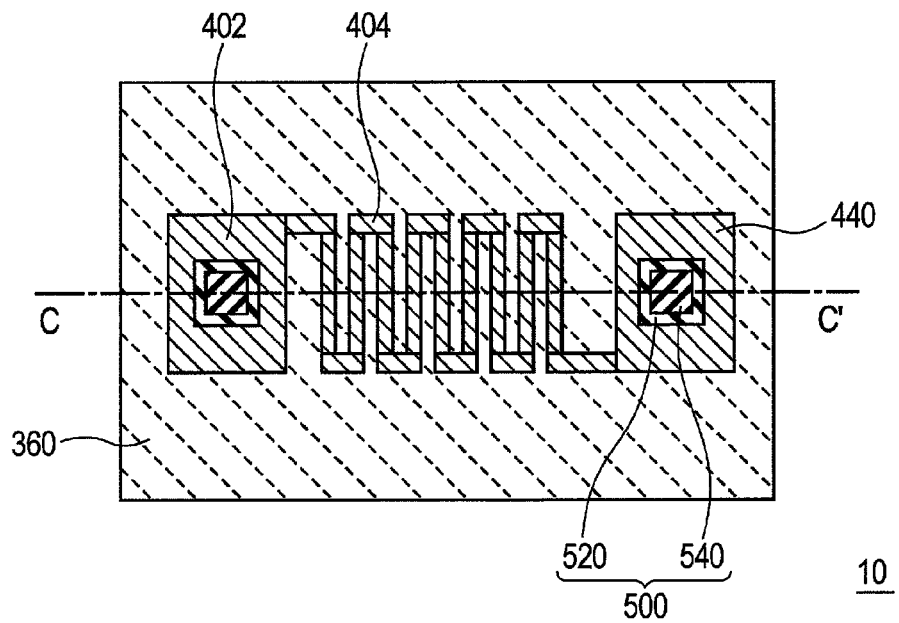
FIGS. 10A and 10B are diagrams showing the configuration of a semiconductor device according to a fourth embodiment.
Figure 10B:
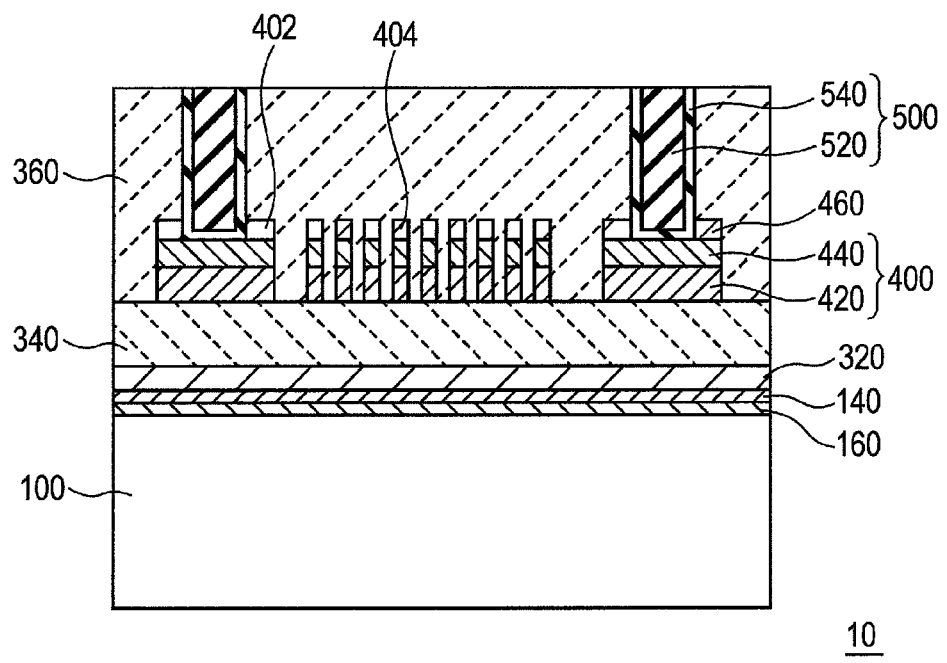

FIGS. 10A and 10B are diagrams showing the configuration of the semiconductor device 10 according to a fourth embodiment. The fourth embodiment is the same as the first embodiment except that the resistive element 400 is bent multiple times in plan view. Details will be described below.

FIG. 10A is a plan view showing the configuration of the semiconductor device 10 according to the fourth embodiment. FIG. 10A shows only the TaSiN layer 440, the via plugs 500, and the interlayer insulating layer 360 of the semiconductor device 10.

As shown in FIG. 10A, the resistance portion 404 of the resistive element 400 is bent multiple times in plan view. In other words, the resistance portion 404 having a small width and a long length is formed so as to be meandering. The angle of the bend is not limited to any particular angle and is, for example, 90°.

FIG. 10B shows a sectional view taken along line C-C' FIG. 10A. As shown in FIG. 10B, the contact portions 402 and the resistance portion 404 are formed in the same layer. Vias 500 are coupled to the contact portions 402. The resistance portion 404 is formed with a width smaller than the contact portions 402.

According to the fourth embodiment, the resistive element 400 is formed so as to be bent multiple times. Thus, the length of the resistance portion 404 can be increased. As a result, the resistance of the resistive element 400 can be increased.

While the resistive element 400 is formed in the same layer in the fourth embodiment, it may be bent in a sectional direction across multiple interlayer insulating layers (not shown).

Fifth Embodiment

Figure 11:
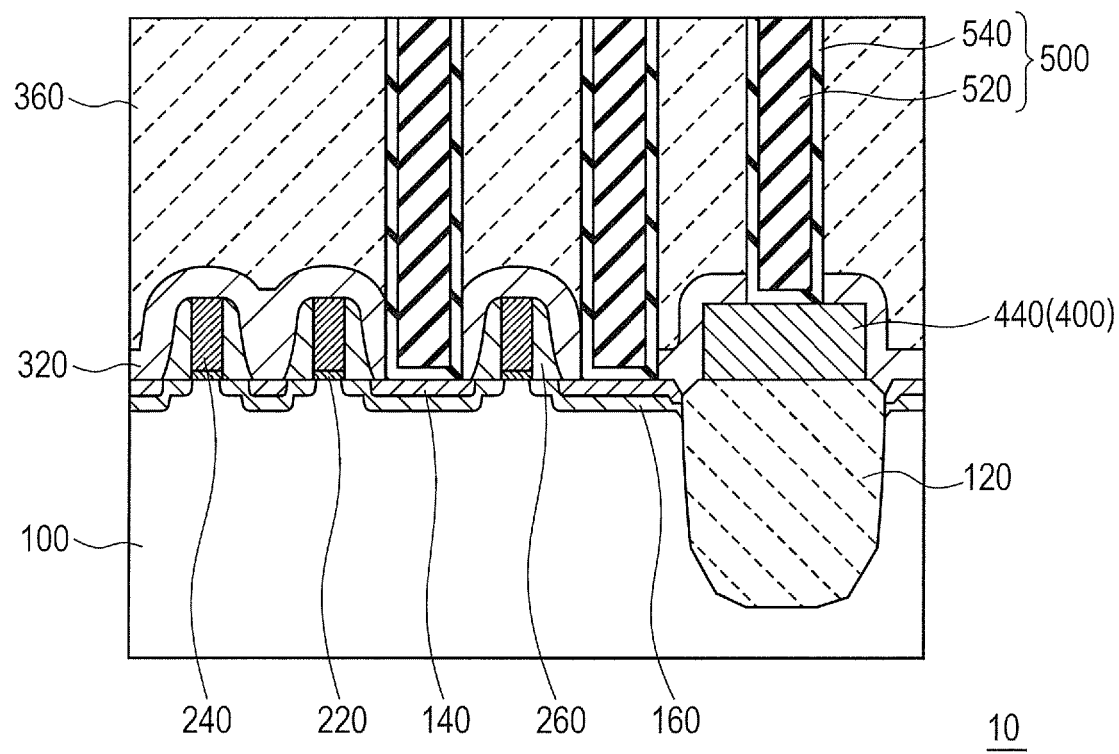
FIG. 11 is a sectional view showing the configuration of a semiconductor device according to a fifth embodiment.

FIG. 11 is a sectional view showing the configuration of the semiconductor device 10 according to a fifth embodiment. The fifth embodiment is the same as the first embodiment except that the first insulating layer is the element isolation region 120. Details will be described below.

As shown in FIG. 11, the first insulating layer may be the element isolation region 120. The TaSiN layer 440 is formed over the element isolation region 120. The TaSiN layer 440 is formed, for example, by modifying the entire TaN layer 420.

The liner insulating layer 320 for covering the FETs can serve also as a SiN layer (not shown) for applying a Si-containing gas to the TaN layer 420.

A method for manufacturing the semiconductor device 10 according to the fifth embodiment is the same as that according to the first embodiment except for the following points.

In FIG. 4A, the TaN layer 420 is formed before forming the liner insulating layer 320. The TaN layer 420 may be formed before the steps of forming the gate insulating layer 220, the gate electrodes 240, and the sidewall insulating layer 260.

Subsequently, the liner insulating layer 320 is formed over the gate insulating layer 220, the gate electrodes 240, and the sidewall insulating layer 260, as well as over the TaN layer 420. This step can serve also as the "silane application step" in the first embodiment.

In this silane application step, the TaN layer 420 is modified to the TaSiN layer 440, starting from the surface layer and side surfaces thereof. If a uniform resistance distribution is desired, it is preferred to modify the entire TaN layer 420 to the TaSiN layer 440.

Later steps are the same as those in the first embodiment.

According to the fifth embodiment, the first insulating layer is the element isolation region 120. Thus, the liner insulating layer 320 for covering the FETs can serve also as a SiN layer (not shown) for applying a Si-containing gas to the TaN layer 420.

While the embodiments of the present invention have been described with reference to the drawings, the embodiments are illustrative only. Various configurations other than those described above can be employed.

What is claimed is:

1. A semiconductor device comprising:
   a first insulating layer;
   a resistive element disposed over the first insulating layer, at least a surface layer of the resistive element being a TaSiN layer;
   an interlayer insulating layer disposed over the first insulating layer and the resistive element; and
   a plurality of via plugs provided in the interlayer insulating layer and having ends coupled to the TaSiN layer,
   wherein a composition ratio of the TaSiN layer varies such that a Si concentration increases toward a surface of the TaSiN layer.

2. The semiconductor device according to claim 1, wherein an absolute temperature coefficient of resistance of the resistive element is 0 ppm/° C. or more and 50 ppm/° C. or less.

3. The semiconductor device according to claim 1, wherein the TaSiN layer is a modified layer formed by applying a Si-containing gas to a TaN layer.

4. The semiconductor device according to claim 1, wherein the resistive element further comprises a TaN layer, and
   wherein the TaSiN layer is disposed over a surface layer of the TaN layer.

5. The semiconductor device according to claim 1, further comprising:
   a SiN layer disposed over the resistive element.

6. The semiconductor device according to claim 1, wherein the TaSiN layer is amorphous.

7. The semiconductor device according to claim 1, wherein the TaSiN layer has a sheet resistance of $10^2$ Ω/sq or more and $10^7$ Ω/sq or less.

8. The semiconductor device according to claim 1, wherein the resistive element is bent multiple times in plan view.

9. The semiconductor device according to claim 1, wherein the resistive element constitutes part of a reference voltage circuit.

10. The semiconductor device according to claim 1, wherein the Si concentration progressively increases toward the surface of the TaSiN layer.

11. The semiconductor device according to claim 1, wherein the composition ratio of the TaSiN layer changes in a stepwise manner.

* * * * *